US008127212B2

(12) United States Patent
Wylie et al.

(10) Patent No.: US 8,127,212 B2
(45) Date of Patent: Feb. 28, 2012

(54) SYSTEM AND METHOD FOR DETERMINING THE FAULT-TOLERANCE OF AN ERASURE CODE

(75) Inventors: John Johnson Wylie, San Francisco, CA (US); Ram Swaminathan, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1157 days.

(21) Appl. No.: 11/904,284

(22) Filed: Sep. 26, 2007

(65) Prior Publication Data
US 2009/0083590 A1   Mar. 26, 2009

(51) Int. Cl.
H03M 13/00 (2006.01)
(52) U.S. Cl. ............ 714/785; 714/6.1; 714/25; 714/770
(58) Field of Classification Search .................. 714/6.1, 714/25, 770, 785
See application file for complete search history.

(56) References Cited

U.S. PATENT DOCUMENTS

| 5,712,861 | A  | * | 1/1998  | Inoue et al. ............... | 714/752 |
| 5,754,563 | A  | * | 5/1998  | White ........................ | 714/757 |
| 7,313,749 | B2 | * | 12/2007 | Nerl et al. ................. | 714/764 |
| 7,350,126 | B2 | * | 3/2008  | Winograd et al. .......... | 714/752 |
| 7,409,625 | B2 | * | 8/2008  | Corbett et al. ............ | 714/770 |
| 7,412,641 | B2 | * | 8/2008  | Shokrollahi ............... | 714/776 |
| 7,853,823 | B2 | * | 12/2010 | Deenadhayalan et al. ... | 714/6.12 |
| 7,870,464 | B2 | * | 1/2011  | Hafner et al. ............. | 714/770 |

OTHER PUBLICATIONS

Moshe Schwartz, *On the Stopping Distance and the Stopping Redundancy of Codes*, IEEE Transactions on Information Theory, vol. 52, No. 3, Mar. 2006.
James Lee Hafner, et al., *Notes on Reliability Models for Non-MDS Erasure Codes*, IBM Research Report, RJ10391 (A0610-035) Oct. 24, 2006, Computer Science.
Peter Corbett et al., *Row-Diagonal Parity for Double Disk Failure Correction*, Proceedings of the Third USENIX Conference on File and Storage Technologies, San Francisco, Calif., USA, Mar. 31-Apr. 2, 2004.
James S. Plank et al., *Small Parity-Check Erasure Codes—Exploration and Observations*, DSN-05: International Conference on Dependable Systems and Networks, Yokohama, Japan, Jun. 2005.
Mario Blaum et al., *EVENODD: An Optimal Scheme for Tolerating Double Disk Failures in RAID Architectures*, IBM Almaden Research Center, IEEE 1994.
Mario Blaum et al., *EVENODD: An Efficient Scheme for Tolerating Double Disk Failures in RAID Architectures*, IEEE Transactions on Computers, vol. 44, No. 2, Feb. 1995.
Yasushi Saito et al., *FABS: Building Distributed Enterprise Disk Arrays from Commodity Components*, ASPLOS '04 Oct. 7-13, 2004.
James Lee Hafner et al., *Matrix Methods for Lost Data Reconstruction in Erasure Codes*, USENIX Association, FAST '05: 4th USENIX Conference on File and Storage Technologies, pp. 183-196.

(Continued)

Primary Examiner — Esaw Abraham

(57) ABSTRACT

A method for determining a fault tolerance of an erasure code includes deriving base erasure patterns from a generator matrix of an erasure code, determining which of the base erasure patterns are adjacent to one another and XORing the adjacent base erasure patterns with one another to produce child erasure patterns of the erasure code. The method further includes combining the base erasure patterns and the child erasure patterns to form a minimal erasures list (MEL) for the erasure code, whereby the MEL corresponds to the fault tolerance of the erasure code. Also provided are methods for communicating and storing data by using the fault tolerance of erasure codes.

25 Claims, 4 Drawing Sheets

OTHER PUBLICATIONS

James Lee Hafner, *WEAVER Codes: Highly Fault Tolerant Erasure Codes for Storage Systems*, USENIX Association, FAST '05: 4th USENIX Conference on File and Storage Technologies, pp. 211-224.

James Lee Hafner, *HoVer Erasure Codes for Disk Arrays*, Proceedings of the 2006 International Conference on Dependable Systems and Networks (DSN '06).

Brendan D. McKay, *Practical Graph Isomorphism*, Congressus Numerantium, vol. 30 (1981, pp. 45-87.

Michael G. Luby et al., *Practical Loss-Resilient Codes*, STOC '97, El Paso, Tex., pp. 150-159.

David A. Patterson et al., *A Case for Redundant Arrays of Inexpensive Disks (RAID)*, 1988 ACM 0-89791-268-3, pp. 109-116.

James S. Plank et al., *A Practical Analysis of Low-Density Parity-Check Erasure Codes for Wide-Area Storage Applications*, DSN-2004: The International Conference on Dependable Systems and Networks, IEEE, Florence, Italy, Jun. 2004.

James S. Plank, *T1: Erasure Codes for Storage Applications*, PowerPoint presentation for the USENIX FAST 2005; 4th USENIX Conference on File and Storage Technologies, Dec. 13-15, 2005, pp. 1-74.

KK Rao et al., *Reliability for Networked Storage Nodes*, Proceedings of the 2006 International Conference on Dependable Systems and Networks (DSN '06).

Wylie et al.; "Determining Fault Tolerance of XOR-Based Erasure Codes Efficiently," 37th Annual IEEE/IFIP International Conference on Dependable Systems and Networks (DSN 2007), 2007, Endinburgh, UK.

\* cited by examiner

SYSTEM AND METHOD FOR DETERMINING THE FAULT-TOLERANCE OF AN ERASURE CODE

BACKGROUND

This section is intended to introduce the reader to various aspects of art, which could be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Erasure codes are implemented in network systems and storage devices as a tool for recovering data which has been lost, degraded or otherwise compromised. Erasure codes are typically adapted to generate and embed data redundancies within original data packets, thereby encoding the data packets in a prescribed manner. If such data packets become compromised, for example, as might occur during a disk failure, such redundancies could enable recovery of lost data or at least portions thereof. Various types of erasure codes exist including Reed-Solomon codes, RAID 5 and so forth. Unfortunately, encoding and/or decoding operations of such and/or other existing erasure codes are computationally demanding, typically rendering their implementation cumbersome in network systems, storage devices and the like.

Further, erasure codes have varying degrees of fault tolerance. The fault tolerance of an erasure code determines to what extent original data is recoverable from degraded and/or compromised encoded data. However, gauging the fault tolerance of an erasure code is a challenging undertaking to the extent that operation of the above-mentioned systems is done while not taking into account the fault tolerance information. Further, uncertainty in the fault tolerance of an erasure code can impact the manner in which data is allocated between storage devices and/or between multiple communication channels. The inability to determine the fault tolerance of an erasure code could hamper users' capacity to optimally store and/or allocate data in storage devices. This could also impact allocation and routing of data in communication network channels, inasmuch as those systems could not function as desired.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which could vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
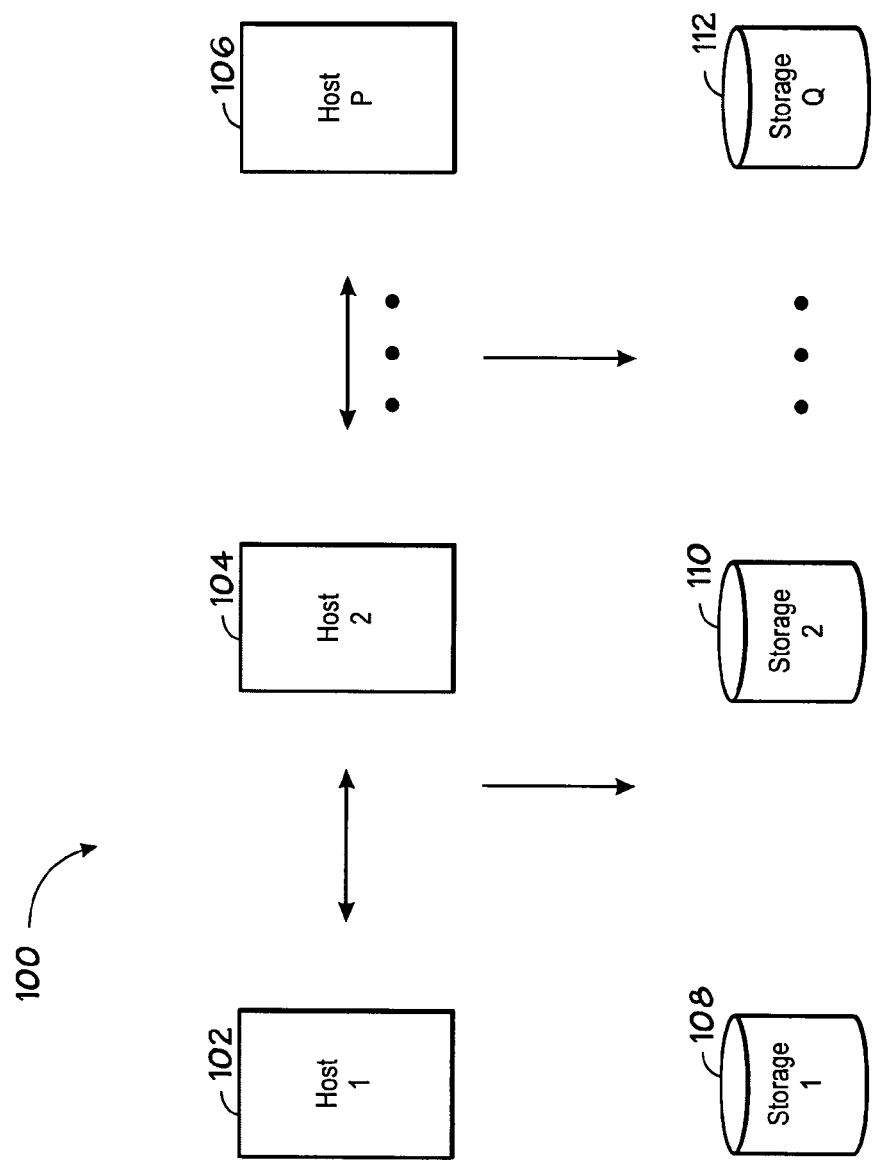
FIG. 1 illustrates a network of devices in accordance with an exemplary embodiment of the present invention.

FIG. 1 illustrates a network of devices in accordance with an exemplary embodiment of the present invention. A network 100 is comprised of a plurality of P computer hosts, labeled herein by referenced numerals 102, 104 and 106. The network 100 further includes a plurality of Q storage devices, labeled herein by reference numerals 108, 110 and 112. In an exemplary embodiment, each of the computer hosts 102-106 comprises a single processing unit or part of a larger computing complex, such as a complex of parallel processors. In other exemplary embodiments, the computer hosts 102-106 comprise part of a server or servers adapted to provide users with communication services and so forth. Still in other embodiments, the hosts 102-106 form a communication network where the hosts 102-106 are adapted to communicate with one another and/or with systems external to the network 100. As will be discussed below, an exemplary embodiment of the present invention provides a method for determining the fault tolerance of erasure codes which, for example, can be used to properly and efficiently communicate data between the hosts 102-106. This could further furnish efficient methods for determining in what manner to encode/decode communication channels with erasure codes. That is, exemplary embodiments of the present invention provide fault tolerance measures/metrics of erasure codes. Such metrics rank the suitability of employing particular types of erasure code with certain communication channels which, for example, are overloaded or are otherwise prone to failures.

The storage devices 108-112, which may be regarded as tangible machine readable mediums, are adapted to store data associated with the hosts 102-106. That is, each of the hosts 102-106 could be coupled to one or more of the storage devices 108-112. Thus, each of the hosts 102-106 could access the storage devices 108-112 for storing and/or retrieving data from those devices. For example, each of the storage devices 108-112 could form an independent memory bank. Alternatively, the devices 108-112 could be interconnected, thus, forming a large memory bank or a subcomplex of a large memory bank. The storage memory devices 108-112 could include magnetic memory devices, optical memory devices, flash memory devices and so forth.

To store and/or retrieve data in or from any one of the devices 108-112, the system 100 employs XOR-based erasure codes of various types. While the illustrated embodiment pertains to implementation of XOR-based erasure codes, it should be appreciated that certain aspects of the present invention could be applied to other erasure codes, some of which are not XOR-based.

In an exemplary embodiment of the present invention, a single erasure code can be implemented across the plurality of computer hosts P and/or the plurality of storage devices Q to recover data that has become damaged or has been otherwise lost during transferring, storing and/or retrieving operations, implemented by hosts 102-106 and/or storage devices 108-112. The present invention enables users to efficiently determine the fault tolerance of the erasure code applied, for example, across the computer host 102-106. Further, information provided by the fault tolerance of the erasure code implemented in the above-mentioned devices enables a user to optimally correlate fragments of the erasure code, such as data and/or parity bits (see below), with reliability levels of each computer hosts 102-106. To the extent reliability levels of each of computer hosts 102-106 and/or storage devices 108-112 can be determined, the data and parity bits of the erasure code can be allocated among the devices of the network 100 for yielding a system having a high degree of data recoverability. For example, data and/or parity bits of the erasure code instrumental in recovering data can be allocated in parallel between those devices of network 100 that are more vulnerable to lossy processes. Thus, the present invention, allows optimal parallel allocation of portions of the erasure code between each computer hosts 102-106 and/or storage devices 108-112 for achieving a data recovery scheme having a high degree of reliability. This increases the robustness of network 100 to recover data lost during the above-mentioned transferring, storing and/or retrieving operations, such as those carried out be a system/network 100.

Still in other exemplary embodiments, each of computer hosts 102-106 and/or storage devices 108-112 can employ a different or a dedicated erasure code whereby each erasure code could have its own fault tolerance. Still in other embodiments, the same erasure code could be serially applied to each of computer hosts 102-106 and/or storage device 108-112. In the case where multiple erasure codes are employed, methods provided by the present invention can be used to efficiently determine the fault tolerance of multiple erasure codes used by the system 100. This, too, facilitates efficient and reliable implementation of data allocation methods and schemes for optimally storing data in each of the storage devices 108-112. One such scheme correlates the fault tolerance of the erasure codes used by the network 100 with reliability levels of each of the storage devices 108-112. For example, erasure codes having a high degree of fault tolerance could be used with a storage device, i.e., one of the storage devices 108-112, that is least reliable. Such a scheme could also be implemented in communicating data between the hosts 102-106. That is, data communication channels that are least reliable are desirably encoded/decoded with erasure codes having a high degree of fault tolerance.

Figure 2:
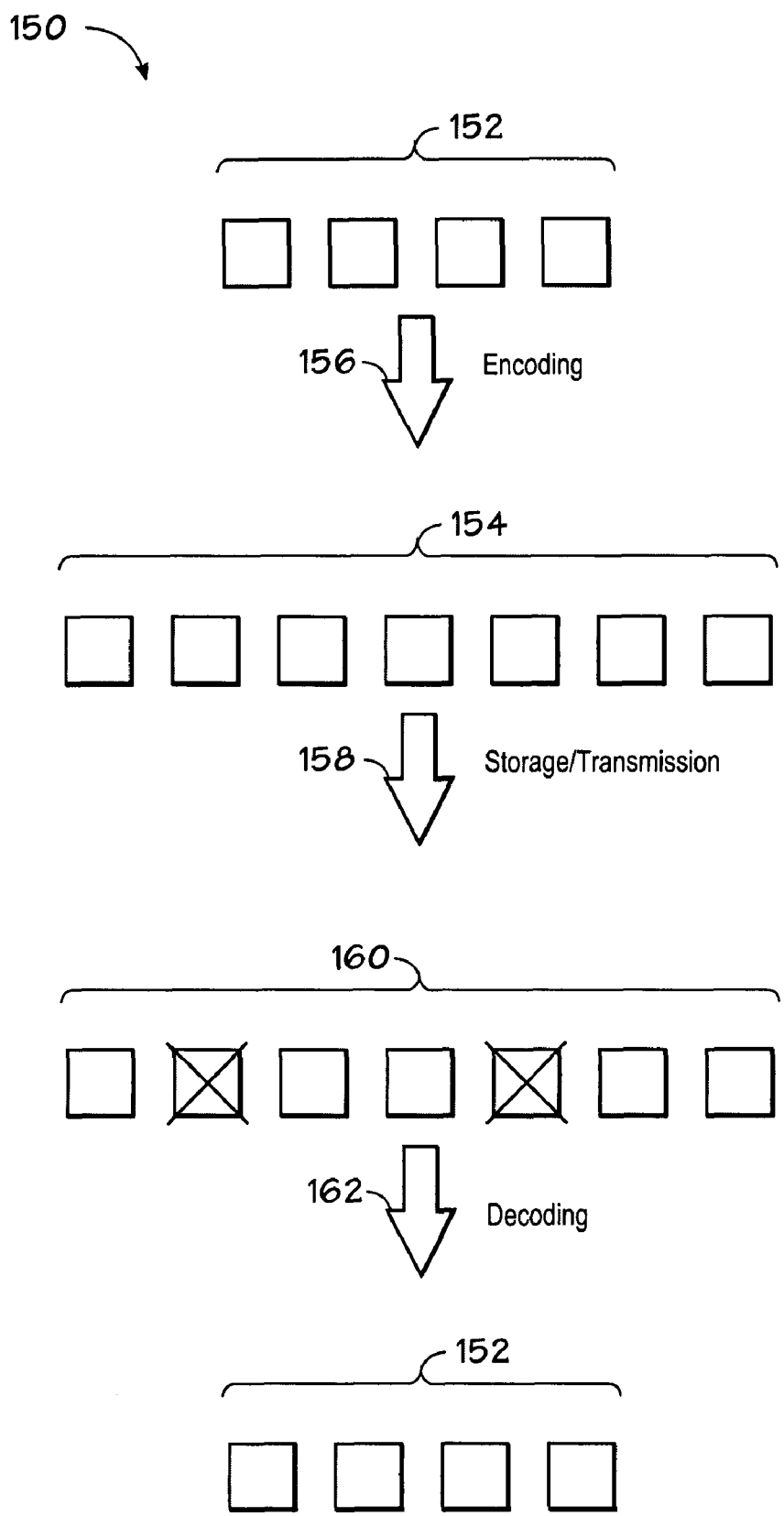
FIG. 2 illustrates encoding and decoding processes implemented by an erasure code in accordance with an embodiment of the present invention.

FIG. 2 illustrates encoding and decoding processes implemented by an erasure code in accordance with an exemplary embodiment of the present invention. The process, which is generally referred to by the reference number 150, includes encoding and decoding steps, as performed by an erasure code, for storing, retrieving and/or transferring data by the network 100. The process 150 is implemented by an erasure code, such as an XOR-based erasure code, adapted to produce erasure resilient data sets. As discussed below, an XOR-based erasure code can be characterized by a generator matrix, whose composition and mathematical properties can be used to determine the fault tolerance of the erasure code. In accordance with exemplary embodiments of the present invention, the fault tolerance of the erasure code is obtained from a minimal erasures list (MEL), which lists all of the code's minimal erasures. An erasure pattern could be formally defined as a set of erasures that leads to irrecoverable data loss. A minimal erasure could be formally defined as an erasure pattern in which every erasure is necessary for it to be an erasure pattern. Hence, rather than enumerating all of erasure patterns of the erasure code, the MEL lists those erasure patterns that are minimal. In this manner, the MEL can be used as an efficient metric for quantifying fault tolerances for erasure codes.

The process 150 begins with an initial data set 152, representing a string of bits, bytes etc. The data set 152 comprises storable, retrievable and/or transferable data, such as the data used by the system 100. As illustrated, an erasure code encodes the data set 152 into data set 154, as indicated by arrow 156. The arrow 156 symbolizes a transformation which transforms the data set 152 into the encoded data set 154. Generally, the transformation 156 operates to create redundancies within the original data set 152, thereby increasing its size to form the data set 154. It should be borne in mind that the implementation of the transformation 156 to create redundancies in the data set 152 could vary depending on the MEL and, for example, on the devices (e.g., 102-106 and 108-112) on which the erasure code is implemented. Because different devices can have degrees of reliability, it might be more desirable to create more redundancies in certain devices than in others. In this manner, redundancy strategies can be formulated for implementing the transformation 156 across the devices 102-106 and/or 108-112. In accordance with an exemplary embodiment of the present invention, the transformation 156 is characterized by a generator matrix from which fault tolerance information can be readily obtained, as will be shown below.

After encoding, the data set 154 undergoes storage, retrieval and/or transfer processes, as indicated by block arrow 158. Again, such processes could be implemented by networks/systems such as those described above in relation to FIG. 1. The step 158 could correspond to, for example, transmitting the data 154 between two individual computers or to a user retrieving data from a server. Alternatively, the step 158 could correspond to data transfer, storage and/or retrieval operations, such as those described above, occurring between the multiple communication and/or storage devices of the network 100. In such occurrences, an erasure code can be implemented and spanned in parallel among the computer hosts 102-106 and storage devices 108-112. Still in other occurrences, a single erasure code or multiple erasure codes could be applied in series between the above-mentioned communication and/or storage devices.

During such processes the data set 154 could, for example, propagate through lossy channels or otherwise be stored in corrupted storage devices which could degrade and/or compromise the data set 154. Hence, if the process 158 is a lossy process, the data 154 could lose some information, resulting in a degraded data set 160. As illustrated, the data set 160 contains a set of erasures (crossed-out portions), corresponding to portions of the data set 154 which have been lost due to the above-mentioned lossy processes. However, those skilled in the art will appreciate that due to the redundancies contained within the data sets 154 and 160, the original data set 152 is recoverable provided that the illustrated set of erasures of data set 160 is within the fault tolerance of the erasure code applied at step 156.

Hence, to recover the original data set 152 a decoding step/process 162 is applied to the data set 160. The decoding process 162 could include applying the inverse of the generator matrix of step 156 to the data 162 so as to obtain the original data set 152. The ability to obtain the original data set 152 from the data set 160 depends on the extent and nature of the set of erasures existing in the data set 160. In certain circumstances, the set of erasures, such as those included in the data set 160, could be critical inasmuch as those erasures exceed the fault tolerance of the erasure code. Accordingly, in such circumstances, the data set 152 becomes irrecoverable.

The ability to determine whether sets of erasures lead to irrecoverable data depends on the fault tolerance of the erasure code. To determine the fault tolerance of the erasure code, the generator matrix applied at step 156 to the data set 152 can be analyzed and manipulated to generate a list of erasure patterns, referred to herein as an erasure list (EL). As stated above, a minimal erasure list (MEL) could be defined as an erasure pattern in which every erasure is necessary for it to be an erasure pattern. Accordingly, the MEL is a subset of the EL. However, it should be appreciated that rather than using brute force methods to deduce the MEL directly from the EL, exemplary embodiments of the present invention (as described below) deduce the MEL via general mathematical methods. Such methods could include analyzing the generator matrix of the erasure code using, for example, Tanner graphs and\or other mathematical constructs to analyze the structure of the erasure code and thereby deduce its fault tolerance. As described further below, such methods could be used to determine the MEL of XOR-based erasure codes, thereby characterizing the fault tolerance of the XOR-based erasure code. It should be borne in mind that in general the MEL is smaller in size than the EL, which makes enumerations of the minimal erasures of the MEL significantly simpler than the enumerations of the erasure patterns of the EL.

Further, an exemplary embodiment of the present invention provides a method for efficiently determining the MEL of a XOR-based erasure code. The efficiency of the method is premised on the fact that there are few minimal erasures relative to the overall number of erasure patterns. The efficiency of the method also relies on effectively employing the structure of the XOR-based erasure code to identify the minimal erasures. As will be shown further below, the implementation of the method can be used to analyze and determine various XOR-based codes. These implementations produce empirical results demonstrating that for a given erasure code there can be significantly fewer (for example, by two orders of magnitude) minimal erasures than all erasure patterns for a given erasure code.

Convenient nomenclature for analyzing the generator matrix of a XOR-based erasure code and parameters used herein throughout are listed in Table 1 below:

TABLE 1

| Symbol | Definition |
| --- | --- |
| n | Total number of symbols in the erasure code. |
| k | Number of data symbols in the code. |
| m | Number of parity symbols in the code. |
| f | A set of erasures. |
| $\hat{f}$ | An erasure pattern. |
| $\tilde{f}$ | A minimal erasure. |
| EL | The erasures list: a list of $\hat{f}$. |
| MEL | The minimal erasures list: a list of $\tilde{f}$. |
| EV | The erasures vector for the EL. |
| MEV | The minimal erasures vector for the MEL. |

Accordingly, a XOR-based erasure code consists of n symbols, k of which are data symbols (s), and m of which are parity symbols (p), otherwise known as redundant symbols. For example, in FIG. 2, the data set 154 consists of n=7 symbols. The data symbols k=4 correspond to the original data set 152, making the parity symbols m=3. As will be appreciated by those skilled in the art, when using XOR-based erasure codes, redundant symbols are referred to as parity symbols. While an exemplary embodiment of the present invention is applied to systematic erasure codes, that is, codes that store the data and parity symbols, other exemplary embodiments according to the present invention could also be applied to erasure codes that are non-systematic. As discussed above, the present invention determines the fault tolerance of the erasure code so that the data k and parity p symbols of the erasure code are optimally allocated among a plurality of storage and/or communication devices, such as those discussed hereinabove with respect to FIG. 1. In this manner, the implementation of the erasure code can be done by fragmenting the various data and parity symbols across the plurality of devices, while taking into account reliability levels of each of the plurality of devices on which the erasure code is implemented.

Referring to Table 1, a set of erasures f is defined as a set of erased or lost symbols. This set could contain either data symbols or parity symbols, some of which might not be recoverable. An erasure pattern $\hat{f}$ is to be defined as a set of erasures that result in at least one data symbol being irrecoverable, i.e., impossible to recover via any decoding method. The erasures list (EL) for an erasure code is the list of all its erasure patterns. A minimal erasure $\tilde{f}$ is an erasure pattern in which every erasure contained therein is necessary for it to be an erasure pattern. That is, if any erasure is removed from the pattern $\tilde{f}$ that pattern is no longer an erasure pattern. Accordingly, the minimal erasure list (MEL) for an erasure code is defined as a list of all its minimal erasures. The EL and the MEL are more compactly represented by an erasure vector (EV) and a minimal erasure vector (MEV), respectively. For example, an EV is a vector of length m with $i^{th}$ element representing the total number of erasure patterns of size i, in the EL. The MEV is defined similarly, but with respect to the MEL. The EV and MEV require only m entries because all erasure sets greater than m in length are necessarily erasure patterns.

Figure 4:
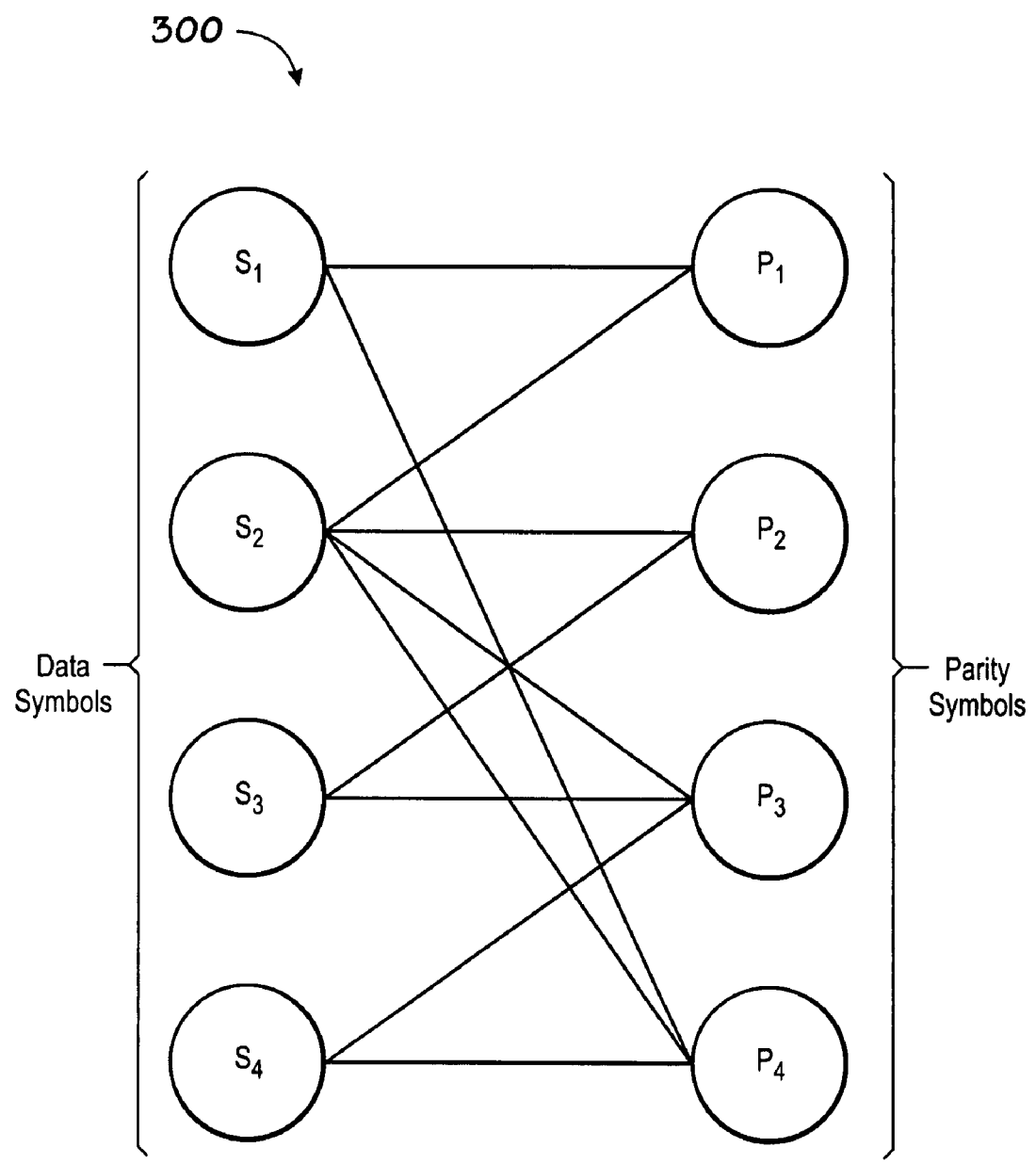
FIG. 4 is a Tanner graph in accordance with an exemplary embodiment of the present invention.

Further, an exemplary embodiment of the present invention uses the structure of an XOR-based erasure code to efficiently generate the MEL. This is primarily achieved by using two representations of the XOR-based erasure code, as given by the generator matrix (see below) and a systematic Tanner graph (FIG. 4). The generator matrix of a (k, m)-code is a $k \times (k+m)$ matrix in a Galois field GF(2). Addition of rows and columns in the generator matrix is done modulo 2, that is, in accordance with the XOR operation. The Generator matrix consists of a $k \times k$ identity matrix, referred to herein as a data submatrix. In addition, the generator matrix consists of m columns of dimension $k \times 1$ appended to the parity submatrix. Each of the m columns in the data submatrix corresponds to a stored data symbol. Each of the m columns in the parity submatrix corresponds to a stored parity symbol. For example, a parity column p has a one in row i, if and only if, data symbol $s_i$ is XOR'ed to determine p. For example, if $p=s_2$ XOR $s_4$ then parity column p has a one in rows 2 and 4 and a zero in all other rows. The erasure pattern induced by ones in the $i^{th}$ row of the generator matrix is referred to as the $i^{th}$ base erasure $\tilde{f}_i$.

Figure 3:
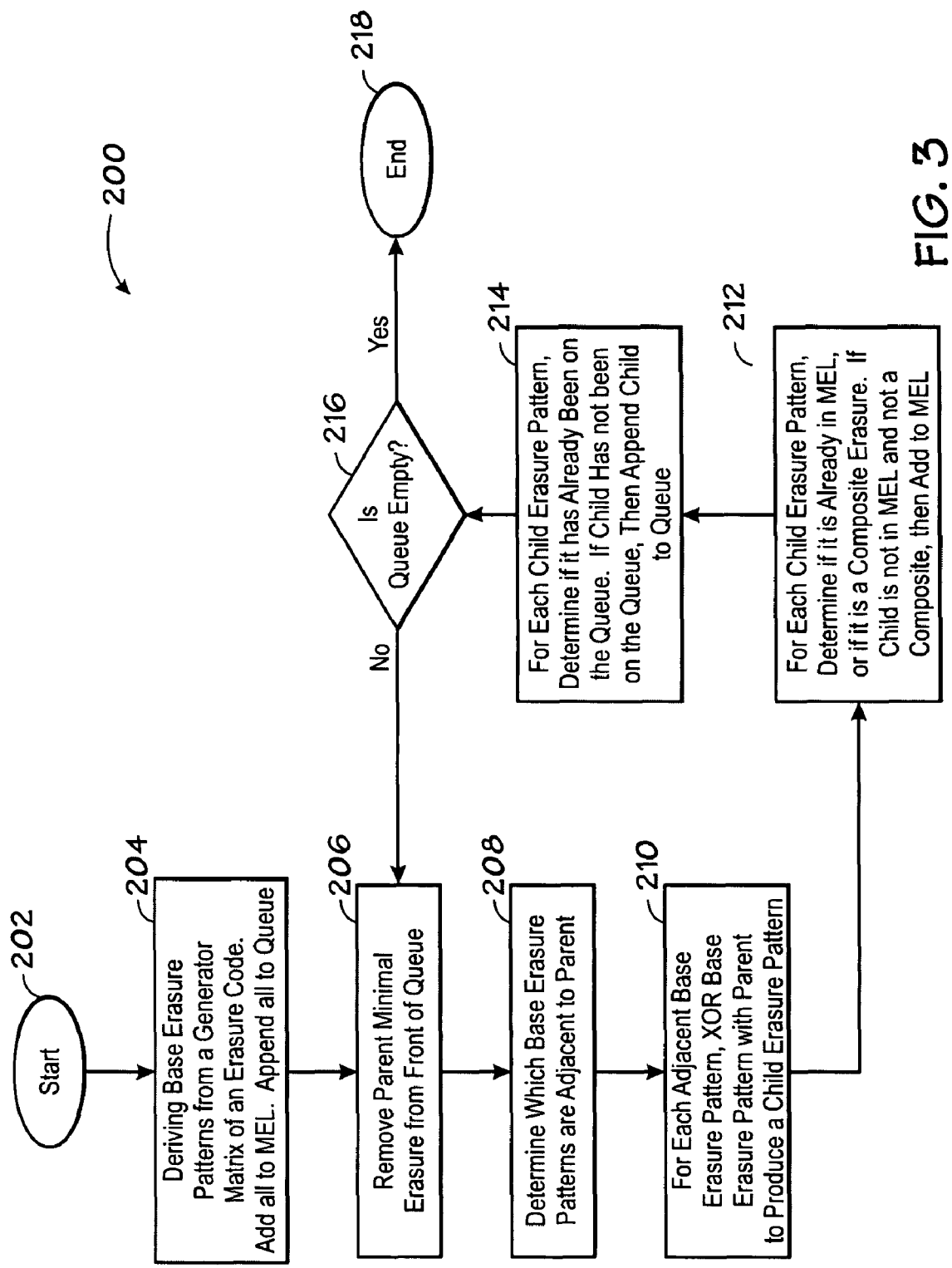
FIG. 3 is a flow chart of a method for determining the fault tolerance of an erasure code, in accordance with an exemplary embodiment of the present invention.

FIG. 3 is a flowchart illustrating a method 200 for determining the MEL of a XOR-based erasure code, in accordance with an exemplary embodiment of the present invention. The method begins at block 202. Thereafter, the method 200 proceeds to block 204 where k base erasure patterns (one for each data symbol) of the erasure code are derived/identified from the generator matrix. The k base erasures identified in step 204 initially form a set of minimal erasures, also referred to herein as parent minimal erasures from which child erasures are further derived. At block 204, all of the identified base erasures are added to the MEL and are, thereafter, appended to a queue. Next, at block 206 parent minimal erasures are removed from the queue. Next, at block 208 the method 200 determines which base erasure patterns identified at step 204 are adjacent. Generally, a data symbol is considered to be adjacent to a minimal erasure if it is connected to a parity symbol in the minimal erasure. Stated otherwise, if two rows of a column of the parity submatrix have an entry of one, then those two rows are considered as adjacent.

Once the adjacent rows of the generator matrix are identified, those rows are XORed with one another at step 210 to produce child erasure patterns. Thus, for every minimal erasure found, i.e., for every parent erasure, the method generates a child erasure pattern for each adjacent row in the generator matrix. At block 212, the method 200 determines whether each of those child erasure patterns generated at block 210 is already in the MEL or is a composite erasure pattern. Those skilled in the art will appreciate that a child erasure pattern is either a minimal erasure not yet in the MEL, a minimal erasure already in the MEL, or a composite erasure i.e., an erasure pattern that can be partitioned into minimal erasures that are already in the MEL. Accordingly, the child erasure patterns which are not already in the MEL or are not composite erasure patterns are added to the MEL, otherwise the child erasure patterns generated at step 210 are not added to the MEL. Thereafter, at block 214, the method 200 determines whether those child erasure patterns added to the MEL at step 212 are already on the queue. If not, then those child erasure patterns are appended to the queue at step 214. From step 214, the method 200 proceeds to decision junction 216 to determine whether the queue on which previously generated erasure patterns were placed is empty. If the queue is empty, then the method 200 terminates at step 218. If the queue is not empty, then the method 200 recurs by returning to block 206.

The method 200 described above can be implemented via a pseudocode given by the following listings of computer commands:

Variables used in the above pseudocode are defined in lines 100-107. A function me_search enumerates the minimal erasures and stores those in a minimal erasures data structure M. The me_search function has two phases. The first phase includes enumerating, e.g., lines 201-208, the minimal erasures. The second phase includes repeatedly enumerating, e.g., lines 209-214, the child erasure patterns. Each of the base erasures corresponds to one row of the generator matrix, consisting of a single data symbol s' and the parities connected thereto, e.g., line 205. Further, every base erasure is enqueued on erasures queue Q (FIFO queue) and is then inserted into M.

As further implemented by the pseudocode, the second phase of the me_search function includes a step in which minimal erasures are dequeued from Q. Thereafter, the me_search function generates and processes the child erasure patterns. Further, in line 301, the me_search function determines which data symbols are adjacent to $\hat{f}$. Hence, there is a child erasure pattern for every adjacent data symbol s'. Child erasure patterns are produced by XORing $\hat{f}$ with $\tilde{f}$, which is the base erasure corresponding to data symbol s'. Specifically, a child erasure pattern is created as follows: s' is added to a parent, (line 303). Thereafter, parities connected to s' are added to the parent (line 308). Next, parities connected to s', as well as to some data symbol in the parent are removed (lines 307 and 308). With regard to $\overline{P}$, there exists at least one

```
/* Types */
100 :s, S      /* Symbol node s; Set of symbol nodes S. */
101 :p, P      /* Parity node p; Set of parity nodes P. */
102 :e, E      /* Edge e is a symbol/parity pair (e = sp); Set of Edges E. */
103 :T         /* Tanner graph. Has structure T.(S, P, E). */
104 :f̂         /* A minimal erasure. Has structure f̂.(S, P) */
105 :M         /* Minimal erasures data structure : a set of f̂. */
106 :M̄         /* Erasure patterns cache : a set of f̂. */
107 :Q         /* Erasures queue : a FIFO queue of f̂. */
/* Search systematic Tanner graph T for minimal erasures. */
me_search    (T)
200 :M ← 0, M̄ ← 0, Q ← 0 /* Initialize data structures . */
201 :/* Generate the k base erasures. */
202 :for all (s' ∈ T.S ) do
203 :    /* P'contains all paraties connected to s'. */
204 :    P' ← {∀p ∈ T.P , ∃ e ∈ T.E : e = s' p}
205 :    f̂ ← ({ s'}, P')
206 :    Q . enqueue    (f̂)
207 :    M ← M ∪ { f̂}
208 :end for
209 :/* Process children of enqueued patterns. */
210 :/* Repeat until no more children are generated . */
211 :while   (Q . length(   ) > 0)do
212 :    f̂ ← Q . dequeue   ()    /* Get next erasure pattern to process. */
213 :    (M ,M̄ ,Q) ← me.children (T ,M ,M̄ ,Q ,f̂)
214 :end while
215 :return  (M )
/* Generate children of f̂ and enqueue them in Q.*/
me_children (T ,M ,M̄ ,Q , f̂)
300 :/* S'contains all symbols that are adjacent to f̂. */
301 :S' ← {∀s ∈ T.S,∃p ∈ f̂.P,∃e ∈ T.E : e = sp } \ f̂.S
302 :for all (s'∈ S')do
303 :    f̃.S ← f̂.S ∪ {s'}
304 :    /* P'contains all paraties in T.P that are connected to s'. */
305 :    P' ← {∀p ∈ T.P,∃ e ∈ T.E : e = s' p}
306 :    /* P̄ contains all paraties in f̂.P that are connected to s'. */
307 :    P̄ ← {∀ p ∈ f̂.P,∃ e ∈ T.E : e = s' p}
308 :    f̃.P ← (f̂.P ∪ P') \ P̄
309 :    if (f̃ ∈ M̄) then continue
310 :    M̄ ← M̄ ∪ {f̃}
311 :    Q.enqueue (f̃)
312 :    if (is_composite( T \ {f̃})) then continue
313 :    M ← M ∪ {f̃}
314 :end for
315 :return  (M, M̄ ,Q)
``` such parity to remove, otherwise the data symbol s' would not be adjacent to $\hat{f}$ (line 309). If the child erasure pattern was previously generated by the me_children function, i.e., it is already in the erasure patterns cache $\overline{M}$, then $\tilde{f}$ is not processed (line 309). Further, if the child erasure pattern has not yet been processed, then it is added to $\overline{M}$ and to the erasures queue Q, as given above by lines 310 and 311, respectively. Each child erasure pattern that is a minimal erasure is inserted into M (line 313). Once all of the children are processed, the me_children function returns updated M, $\overline{M}$ and Q.

Further, line 312 of the pseudocode deals with composite erasures, corresponding to those child erasure patterns that can be partitioned into multiple minimal erasures and, thus, are not added to M. In accordance with an exemplary embodiment of the present invention, a child erasure pattern is further analyzed to determine if it is a minimal erasure or a composite erasure. Accordingly, a function referred to herein as is_composite is called on in line 312 to determine whether $\tilde{f}$ is a composite erasure. This is achieved by testing the rank of a matrix that corresponds to $\{T\backslash \tilde{f}\}\cup\{e \in \tilde{f}\}$. It could be necessary and sufficient to remove a single symbol e from $\tilde{f}$ to test for minimality. Accordingly, if $\tilde{f}$ is a minimal erasure, then removing e yields a matrix of full rank. If $\tilde{f}$ is a composite erasure, removing e yields a matrix not of full rank. It should also be noted that removing erasure e from $\tilde{f}$ makes the symbol corresponding to e available for decoding. Other tests could be performed to determine if a child erasure is a composite erasure. For example, a child erasure that is smaller than the smallest minimal erasure in M: cannot be a composite erasure. Once the pseudocode terminates, the minimal erasure data structure is trivially transformed into both the MEL and the MEV.

In accordance with other embodiments of the present invention, the above pseudo code can be applied to composite erasures as well. Accordingly, the list of composite erasures is possibly a superset of the minimal erasures list, which also includes any minimal erasure unions that are less than m in length. Thus, the above pseudo code can be applied to composite erasures while using the "is composite" test. That is, a matrix rank test can be used to test whether a child erasure pattern is a composite erasure pattern. Other embodiments of the present invention could include searching the MEL to determine whether any entry is a subset of child erasure patterns that are considered by the above methods and pseudocode.

Implementation of the method 200 and the above-mentioned pseudocode can be exemplified using a generator matrix of a XOR-based erasure code having k=4 and m=4. In accordance with an exemplary embodiment of the present invention, the generator matrix of such an erasure code could be represented as:

$$\begin{bmatrix} s_1 & s_2 & s_3 & s_4 & p_1 & p_2 & p_3 & p_4 & \\ 1 & 0 & 0 & 0 & 1 & 0 & 0 & 1 & \tilde{f}_{s1} \\ 0 & 1 & 0 & 0 & 1 & 1 & 1 & 1 & \tilde{f}_{s2} \\ 0 & 0 & 1 & 0 & 0 & 1 & 1 & 0 & \tilde{f}_{s3} \\ 0 & 0 & 0 & 1 & 0 & 0 & 1 & 1 & \tilde{f}_{s4} \end{bmatrix}$$

First, it should be noted that the upper row and the right column of the above matrix are not matrix elements per se, but are reserved for indicating data symbol columns ($s_i$) or parity columns ($p_i$), and base erasure rows $\tilde{f}_{si}$, respectively. The columns in the generator matrix are labeled as either a data column or a parity column, and the rows are labeled as base erasures.

Table 2 below summarizes the execution of the method 200 and pseudocode as applied to the above matrix.

TABLE 2

| Q.dequeue | $\hat{f}$ | M |
|---|---|---|
| | ($s_1$, $p_1$, $p_4$) | ✓ |
| | ($s_2$, $p_1$, $p_2$, $p_3$, $p_4$) | ✓ |
| | ($s_3$, $p_2$, $p_3$) | ✓ |
| | ($s_4$, $p_3$, $p_4$) | ✓ |
| ($s_1$, $p_1$, $p_4$) | ($s_1$, $s_2$, $p_2$, $p_3$) | ✓ |
| | ($s_1$, $s_4$, $p_1$, $p_3$) | ✓ |
| ($s_2$, $p_1$, $p_2$, $p_3$, $p_4$) | ($s_1$, $s_2$, $p_2$, $p_3$) | x |
| | ($s_2$, $s_3$, $p_1$, $p_4$) | ✓ |
| | ($s_2$, $s_4$, $p_1$, $p_2$) | ✓ |
| ($s_3$, $p_2$, $p_3$) | ($s_2$, $s_3$, $p_1$, $p_4$) | x |
| | ($s_3$, $s_4$, $p_2$, $p_4$) | ✓ |
| ($s_4$, $p_3$, $p_4$) | ($s_1$, $s_4$, $p_1$, $p_3$) | x |
| | ($s_2$, $s_4$, $p_1$, $p_2$) | x |
| | ($s_3$, $s_4$, $p_2$, $p_4$) | x |
| ($s_1$, $s_2$, $p_2$, $p_3$) | ($s_1$, $s_2$, $s_3$) | ✓ |
| | ($s_1$, $s_2$, $s_4$, $p_2$, $p_4$) | ✓ |
| ... | ... | ... |
| ... | ... | ... |

The first column of Table 2 lists the erasure pattern being processed by the function me_children. The second column of Table 2 lists the children of the base erasure $\hat{f}$. The third column of Table 2 indicates (via checkmark) whether $\hat{f}$ is inserted into M and enqueued in Q. The first four rows of Table 2 illustrate the base erasures $\tilde{f}_{si}$ processed by me_search. The remaining rows of Table 2 illustrate the children generated by dequeuing erasure patterns from Q. These rows further indicate which children are inserted into M. If a child is already in M, then it is not inserted again. The ellipsis at the bottom of Table 2 indicate that the ME algorithm continues for some number of additional steps before terminating. Accordingly, from Table 2 the MEL of the erasure code characterized by the above matrix is given by the following minimal erasures: {(s1, p1, p4), (s3, p2, p3), (s4, p3, p4), (s1, s2, s3), (s1, s2, p2, p3), (s2, s3, p1, p4), (s2, s4, p1, p2), (s2, s3, p1, p4), (s3, s4, p2, p4)}. Accordingly, for the above matrix, any f longer than m=4 is elided from the MEL. Further, an MEV characterizing the above MEL is given as: (0, 0, 4, 5).

FIG. 4 is a Tanner graph 300 used in accordance with an exemplary embodiment of the present invention. Tanner graphs, such as the Tanner graph 300, is used to succinctly capture the structure of the erasure code. Specifically, Tanner graphs could be used in determining adjacencies of rows of a generator matrix. This facilitates implementation of the above method 200 for deriving children erasure patterns from parent minimal erasure patterns. Further, the Tanner graph 300 can facilitate the construction of the MEL of an erasure code, as given by Table 2 above. In accordance with an exemplary embodiment of the present invention, a Tanner graph is bipartite graph that has k data symbols on one side and m parity symbols on another side. For example, for the first erasure pattern given by ($s_3$, $p_1$, $p_4$), connectivity of data and parity symbols shown by the Tanner graph 300 established that data symbols $s_2$ and $s_4$ are adjacent. Those skilled in the art will appreciate that additional adjacencies can be derived in a similar manner so as to facilitate computations leading to the erasure patterns shown in Table 2, from which the MEL is derived.

To validate the method 200 and the pseudocode discussed above, various mathematical theorems, lemmas and statements can be employed to establish the correctness of the MEL as being a measure of the fault tolerance of an erasure code. Proofs of these theorems as applied to the MEL are provided below. Accordingly, in general, it can be proven that an MEL of a XOR-based erasure code completely describes its fault tolerance, i.e., the MEL contains all information contained within the EL. It can further be shown that the methods described above for producing the MEL for a given erasure code are indeed correct. To achieve this, it is first proven that the MEL is a complete description of a XOR-based erasure code's fault tolerance. Accordingly, the following theorem is cited:

Theorem 1: If the fault tolerance of a XOR-based erasure code can be obtained through the EL, it can also be obtained through the MEL.

Proof: by definition of minimality, every minimal erasure is an erasure pattern. For each erasure pattern $\hat{f}$ in EL, write down all possible minimal erasures. This can be done by exhaustively removing data and parity symbols from $\hat{f}$. As is apparent, from each of these minimal erasures, the original erasure pattern $\hat{f}$ can be generated by adding back respective data and parity symbols that were removed from $\hat{f}$. Hence, by taking the union of all these minimal erasures, the aforementioned theorem 1 follows, because this union is the MEL and every erasure pattern in the MEL can be generated from some minimal erasure in the MEL.

Next, a generator matrix for an erasure code and an erasure set f is considered. A matrix that corresponds to the generator matrix with all data and parity columns from which f is removed is considered herein as a recovery matrix. The recovery matrix is referred to as a defective recovery matrix if it cannot be used to recover some data symbol. Rows of the recovery matrix that correspond to the data symbols in f (referred via the notation f.S) are referred herein as lost data rows.

Proposition 2: A recovery matrix is defective if and only if its rank is less than k.

Proof: This follows from the definitions of erasure pattern and defective recovery matrix.

Lemma 3: Every base erasure is a minimal erasure.

Proof: First, a base erasure $\tilde{f}_b$ is an erasure pattern. By definition, a base erasure precisely corresponds to a row of the generator matrix. The recovery matrix induced by $\tilde{f}_b$ has rank of k−1 because it has an all zero row, that is, the single lost data row and a (k−1)×(k−1) identity matrix in the data submatrix. Therefore, by proposition 2, the recovery matrix is defective.

A base erasure can be shown to be a minimal erasure by establishing that if any of the columns in the generator matrix (those which are not in the recovery matrix) is added into the recovery matrix, then the recovery matrix would have rank k. If data column $s_b$ corresponding to $\tilde{f}_b$ is added into the recovery matrix, then the data submatrix would contain an k×k identity matrix. Hence, the data submatrix has full rank and is therefore not defective. If one of the parity columns corresponding to some parity symbol p∈$\tilde{f}_b$.P is added into the recovery matrix, then a column swap operation can move it into the data submatrix. Column additions within the data submatrix can then be performed until an identity matrix of size k×k is established.

Lemma 4: The addition (XOR) of any subset of the collection of base erasures is an erasure pattern.

Proof: Let $\tilde{f}_1, \ldots, \tilde{f}_k$ denote the set of base erasures, and $f = \oplus_{i=1}^{k} \tilde{f}_i$ denote their sum. Consider the recovery matrix induced by f. Each of the lost data rows of the recovery matrix can be written as a linear combination of all of the other lost data rows. The lost data rows of the data submatrix are all zeroes and are, therefore, linear combinations of one another. The lost data rows of all the parity columns in the recovery matrix have even parity. Therefore, in each lost data row, each parity column is either a zero or a one. In either case, this can be written as a linear combination of other lost data rows. If the column is a zero, then the other rows have even parity, and their sum is zero. If the column has a one, then the other rows have odd parity and their sum is one. Therefore, the rank of the recovery matrix must be less than k, rendering the matrix defective. Hence, f is an erasure pattern.

The above lemma cannot be strengthened to the extent that establishes that f is a minimal erasure. The XOR of some sets of base erasures in some codes results in composite erasures comprised of two or more minimal erasures. However, all minimal erasures can be generated through the addition of base erasures. This can be established by proving the following theorem:

Theorem 5: Every minimal erasure can be obtained by the addition of some set of base erasures.

Proof. Consider a minimal erasure $\tilde{f}$. By Proposition 2, the rank of the recovery matrix induced by $\tilde{f}$ is less than k and, therefore, at least one lost data row in the recovery matrix is linearly dependent on the other lost data rows or the data row is all zeros. This can further be established by stating the following:

Statement 6: Every lost data row in the recovery matrix induced by $\tilde{f}$ is linearly dependent on the rest of the lost data rows, or is all zeroes.

Proof. Assuming there exist lost data rows in the recovery matrix that are not linearly dependent on the rest of the lost data rows. Ignoring all such rows; the remaining lost data rows are either linearly dependent on one another or a single lost data row remains. If a single lost data row remains, then by Lemma 3 the data row is a base erasure (and is all zeroes), which is a contradiction to the minimality of $\tilde{f}$. On the other hand, letting S' be the set of data symbols that correspond to the lost data rows that are linearly dependent on one another, then S' ⊂ $\tilde{f}$.S. Further, by proposition 2, {S'∪$\tilde{f}$.P} is an erasure pattern, which is a contradiction to the minimality of $\tilde{f}$.

Statement 7: In any subset of rows corresponding to lost data symbols in the recovery matrix, if every row is linearly dependent on the rest of the rows, then the respective parity columns must have even parity.

Proof: Assuming there is a column that has odd parity. A lost data row with a zero in this column cannot be linearly dependent on all other lost data rows.

By statements 6 and 7, the parity columns of the recovery matrix induced by $\tilde{f}$ must have even parity. Therefore, by an argument similar to the one made above with regard to the proof of Lemma 4, $\tilde{f}$ can be written as the sum of the base erasures that correspond to the data symbols in $\tilde{f}$.S, which proves statement 7.

Further, in accordance with an exemplary embodiment of the present invention, numerical bounds on |MEL| and |EL| are established. Specifically the bound on the size of the |EL| is given by the following mathematical relation:

$$|EL| \leq \sum_{i=1}^{m} \binom{k+m}{i} < 2^{k+m}$$

It should be noted that all erasure patterns of interest are less than or equal to m in length for tightening the bound on |EL|.

Further, a base erasures list (BEL) is defined as the XOR of each set in a powerset of base erasures, except the null set. Accordingly, the BEL is a union of all minimal erasures and all composite erasures. The bound on the size of the |BEL| is given by the following mathematical relation:

$$|BEL| \leq \begin{cases} \sum_{i=1}^{m} \binom{k}{i} & \text{if } m < k \\ 2^k & \text{if } m \geq k \end{cases}$$

Further, the bound on the size of the |MEL| is given by the following mathematical relation:

$$|MEL| \leq \begin{cases} \min\left(\binom{k+m}{m}, \sum_{i=1}^{m}\binom{k}{i}\right) & \text{if } m < k \\ \min\left(\binom{k+m}{\lfloor(k+m)/2\rfloor}, 2^k\right) & \text{if } m \geq k \end{cases}$$

As shown by these relations, the difference in the bounds on the |EL| and on the |MEL| suggests that there are many more erasure patterns than minimal erasures. These relations further indicate that the number of minimal erasures grows exponentially in k.

The above mathematical relations can be applied to the exemplary generator matrix of the XOR-based erasure code discussed above. For such an erasure code, the size of the MEL is 9, which is less than the size of that code's BEL=$2^{4}=16$. The MEL is also much less than that code's EL=29. This value is also in accord with the bound of the |EL|, that is, $$9 < \sum_{i=1}^{4}\binom{8}{i} = 162,$$

as calculated for the above erasure code.

Further, the above mentioned EV and MEV can be used to compare the fault tolerance of any two XOR-based erasure codes. An erasure vector is written as $(j_1 \ldots j_m)$, where $j_1$ is the number of erasure patterns of size i. A minimal erasure vector is written in a similar manner. It should be noted that the first non-zero entry, $j_i$, in the MEV and the EV for a code are identical and indicate that the erasure code's Hamming distance is i. That is, the erasure code tolerates all erasures of size i−1.

Erasure vectors could be compared by comparing shortest to longest vector values, i.e., from 1 to m. For example, if EV=(0, 4, 5) and EV'=(0, 0, 10), the EV<EV', because 4>0. In another example, if EV=(0, 4, 5) and EV'=(0, 4, 4), then EV<EV', because 5>4. If EV<EV' then the erasure code corresponding to EV' is more fault tolerant. Minimal erasure vectors can be compared in a similar fashion. For two codes having the same k and m, comparing the MEVs of the erasure codes is equivalent to comparing those code's EVs. For two codes that differ in k and/or in m, the result of comparing the MEVs of the codes is only necessarily the same as the result of comparing their EVs if those codes have different Hamming distances. Alternatively, the comparison is the same if those codes have the same Hamming distance, but have different values for their respective MEVs at the Hamming distance.

In an exemplary embodiment of the present invention described below, an evaluation for determining the correctness of the implementation of the method 200 is performed. Accordingly, an implementation of an erasure code is carried out so as to determine the MEV of all XOR-based erasure codes with 2≦m≦k<7. As will be discussed below, this evaluation results in identifying the most fault tolerant XOR-based erasure codes over the aforementioned parameters. Further, this implementation indicates that the average of the ratio |EL|/|MEL| tends to increase with k and m. For example, for some codes, the average of this ratio could be over 69 for one corpus of the code. These results support the statement that it is more efficient to determine the MEL than the EL, especially, as k and m increase.

To computationally implement the method 200 and the pseudocode, various computer languages are used, one of which is Python 2.4.3. Python code is easy to modify and, therefore, allows quick prototype modifications and extensions of the method 200. The minimal erasures data structure and cache M and $\overline{M}$, respectively, are implemented via m dictionaries. Further, in accordance with an exemplary embodiment of the present invention, erasure patterns are stored as bitmaps, rendering comparison of such patterns more concise and efficient. In addition, testing for membership in a dictionary are efficiently performed in Python, as dictionaries keep track of the number of elements they store. Therefore, converting from M to the MEV becomes a trivial task using such software platform. In addition, the minimal erasures queue Q is a FIFO queue.

Further, tools using set operations could be used to efficiently transform a MEL into an EL. Such tools perform O(|EL|) operations and are efficient only in that they do not perform any matrix rank tests. Further, software packages, such as nauty version 2.2 with gtools, are used to generate Tanner graphs, such as that shown in FIG. 4. Specifically, a software package, such a genbg, is used to generate non-isomorphic bipartite graphs that can be translated into systematic Tanner graphs. Those skilled in the art will appreciate that isomorphic Tanner graphs have similar fault tolerance characteristics rendering them suitable for evaluating non-isomorphic Tanner graphs. The set of all possible non-isomorphic systematic Tanner graphs with a common k and m are referred to herein as (k, m)-code corpus. Accordingly, for a given k and m, there are up to $2^{km}$ possible systematic-based codes. These and other software packages used for implementing the method 200 are executed using a HP DL360 computer with a 2.8 GHz Intel Xeon processor and 4 GB of RAM.

To validate the correctness of the implementation of the method 200, the MEL is generated for a given erasure code using a specific program, referred to herein as ela. This program also generates the EL for the given code. Generally, the ela program initially performs a matrix rank test for every erasure pattern with one erasure. Subsequently, the program performs a matrix operation for all erasure patterns with two, three etc., erasures, up to all erasure patterns having m erasures. The matrix rank test is used to indicate whether the erasure pattern is decodable.

Further, an additional program, referred to herein as el2mel, is used to filter the EL output by the e/a program, thereby producing the MEL. The implementation of the e/2me/ program is based on inserting the erasure patterns in the EL into a data structure that checks for the MEL subset. Accordingly, if an erasure pattern is a superset of an erasure pattern that is already in the data structure, then that superset erasure pattern is not inserted into the MEL. If an erasure pattern is successfully inserted, then all larger erasure patterns in the data structure are checked to see if they are a superset of the inserted erasure pattern. Thus, any erasure patterns that are a superset are removed from the data structure.

In accordance with an exemplary embodiment of the present invention, the correctness of the method 200 is validated for a (4, 4)-code corpus, which contains 179 erasure codes. The output produced by implementing the method 200 exactly matches the output produced by the e/a program, which is further piped into the e/2me/ program. Those skilled in the art will appreciate that the implementation of the method 200, as applied to the above code corpus, have an execution time less than a second.

Next, evaluation of the fault tolerance of an XOR-based erasure code using the method 200 is performed, in accordance with an exemplary embodiment of the present invention. The evaluation is applied to all (k, m)-code corpi for $2 \leq m \leq k \leq 7$. Accordingly, the results of applying the method 200 to the above-mentioned erasure codes are listed below in Table 3:

entry in MEV*). The ninth column, labeled |EL|/|MEL|, lists the average of the ratio |EL| to |MEL| for the corpus.

The following observations can be deduced from the results listed in Table 3: first, the average of the ratio |EL|/|MEL| tends to increase with both k and m. For the (7, 7)-code corpus, the direct calculation of the EL has 69.1 times more steps than the calculation of the MEL. Second, as m increases for some fixed k, the best MEV improves, corresponding to an increase in redundancy. As k increases for some fixed m, the best MEV degrades, as the same amount of redundancy is used to protected more data. Third, as k and m increase, very few codes share the absolute best MEV. For example, in the (7, 7)-code corpus, only 1 in 1.48 million codes has the best fault tolerance, while 1 in 30 codes share the best Hamming distance. Fourth, the data symbols for the best codes are included by at least d* parity symbols. Hence, the best codes have higher Hamming weight, i.e., are more connected, than existing LDPC methods. Fifth, from the above results there does not appear to exist a systematic-based erasure code with $5 \leq k \leq 7$ and m=7 that tolerates all erasures of size 4.

Those skilled in the art will appreciate that by virtue of considering only non-isomorphic Tanner graphs the number of codes is reduced considerably. For example, for the (7, 7)-code corpus, the reduction is greater by a factor exceeding 19 million.

TABLE 3

| K | m | # in corpus | # w MEV* | # w d* | A parity submatrix w MEV * | MEV* | d* | |EL|/|MEL| |
|---|---|---|---|---|---|---|---|---|
| 2 | 2 | 3 | 2 | 3 | 1, 3 | (0, 1) | 2 | 1.8 |
| 3 | 2 | 5 | 2 | 5 | 3, 5 | (0, 2) | 2 | 2.0 |
| 3 | 3 | 17 | 2 | 2 | 3, 5, 6 | (0, 0, 4) | 3 | 2.8 |
| 4 | 2 | 8 | 1 | 8 | 7, 11 | (0, 3) | 2 | 2.0 |
| 4 | 3 | 42 | 1 | 1 | 7, 11, 13 | (0, 0, 7) | 3 | 3.4 |
| 4 | 4 | 179 | 1 | 1 | 7, 11, 13, 14 | (0, 0, 0, 14) | 4 | 6.3 |
| 5 | 2 | 11 | 2 | 11 | 7, 27 | (0, 5) | 2 | 2.3 |
| 5 | 3 | 91 | 3 | 91 | 7, 11, 29 | (0, 1, 10) | 2 | 4.0 |
| 5 | 4 | 633 | 3 | 35 | 7, 11, 19, 29 | (0, 0, 4, 14) | 3 | 7.6 |
| 5 | 5 | 3835 | 2 | 14 | 7, 11, 19, 29, 30 | (0, 0, 0, 10, 16) | 4 | 14.7 |
| 6 | 2 | 15 | 2 | 15 | 15, 51 | (0, 7) | 2 | 2.4 |
| 6 | 3 | 180 | 6 | 180 | 7, 27, 45 | (0, 2, 14) | 2 | 4.6 |
| 6 | 4 | 2001 | 6 | 35 | 7, 27, 45, 56 | (0, 0, 8, 18) | 3 | 8.8 |
| 6 | 5 | 20755 | 7 | 12 | 7, 25, 42, 52, 63 | (0, 0, 0, 25, 0) | 4 | 16.9 |
| 6 | 6 | 200082 | 5 | 1338 | 7, 27, 30, 45, 53, 56 | (0, 0, 0, 6, 24, 16) | 4 | 31.8 |
| 7 | 2 | 19 | 1 | 19 | 31, 103 | (0, 9) | 2 | 2.6 |
| 7 | 3 | 328 | 7 | 328 | 15, 51, 85 | (0, 3, 19) | 2 | 5.1 |
| 7 | 4 | 5745 | 10 | 28 | 15, 54, 90, 113 | (0, 0, 12, 26) | 3 | 10.1 |
| 7 | 5 | 102089 | 8 | 10 | 7, 57, 90, 108, 119 | (0, 0, 0, 38, 0) | 4 | 19.1 |
| 7 | 6 | 1781941 | 57 | 2610 | 7, 46, 56, 75, 85, 118 | (0, 0, 0, 14, 28, 24) | 4 | 35.7 |
| 7 | 7 | 29610804 | 20 | 965097 | 7, 27, 45, 51, 86, 110, 120 | (0, 0, 0, 3, 24, 36, 16) | 4 | 69.1 |

The first two columns of Table 3 list k and m for each code corpus. The third column lists the number of codes in the (k, m)-code corpus. The fourth column labeled, # w MEV*, lists the number of codes in the corpus that share the best minimal erasures vector. The fifth column labeled, # w MEV*, lists the number of codes in the corpus that share the best Hamming distance. The sixth column of Table 3 lists a parity submatrix for a code from the corpus that has an MEV equal to MEV*. The parity submatrix is in "bitmap" representation, whereby each integer represents a column of the parity submatrix (i.e., if the parity symbol includes data symbol $s_j$, then add $2^{j-1}$ to the integer representation). For example, for the (4, 3)-code corpus, "7, 11, 13" means that the first parity is the XOR of $s_1$, $s_2$ and $s_3$. The second parity is the XOR of $s_1$, $s_2$ and $s_4$, and the third parity is the XOR of $s_1$, $s_3$ and $s_4$. The seventh column of Table 3, labeled MEV*, lists the value of the best in the corpus. The eighth column labeled, d* lists the best Hamming distance in the corpus (i.e., the index of the first non-zero While the invention could be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method for determining a fault tolerance of an erasure code, comprising:
    deriving in a computer host base erasure patterns from a generator matrix of an erasure code;
    determining in the computer host which of the base erasure patterns are adjacent to one another;
    XORing in the computer host the adjacent base erasure patterns with one another to generate child erasure patterns of the erasure code; and combining the base erasure patterns and the child erasure patterns to form a minimal erasure list (MEL) for the erasure code, wherein the MEL corresponds to the fault tolerance of the erasure code, and wherein the MEL is used for allocating the erasure code across multiple devices.

2. The method of claim 1, comprising XORing the child erasure patterns with the base erasure patterns to produce additional child erasure patterns that are added to the MEL.

3. The method of claim 1, comprising determining whether each of the generated child erasure patterns is already in the MEL, or whether each of the generated child erasure patterns is a composite erasure.

4. The method of claim 3, comprising adding a generated child erasure patterns to the MEL if the child erasure pattern is not already in the MEL or if the child erasure pattern is not a composite erasure.

5. The method of claim 1, wherein the method terminates when the produced child erasure patterns are not adjacent to any of the base erasures, or when the produced child erasure patterns are identical to previously generated child erasure patterns, or when a specific number of child erasure patterns are produced.

6. The method of claim 1, wherein adjacency of the base erasure patterns with one another and/or with the child erasure patterns is determined using a Tanner graph, or the generator matrix, or a lookup table, or a combination thereof.

7. The method of claim 1, wherein the erasure code is a systematic erasure code.

8. The method of claim 1, wherein the erasure code is non-systematic erasure code.

9. The method of claim 1, wherein the devices are multiple storage devices, and wherein the method comprises determining a reliability for each of the storage devices, and storing data within each of the storage devices in accordance with the reliability of each storage device and in accordance with the fault tolerance of the erasure code associated with the storage devices.

10. The method of claim 1, wherein the devices are multiple communication channels, and wherein the method comprises determining a reliability for each of the communication channels, and communicating data over each of the communication channels in accordance with the reliability of each communication channel and the fault tolerance of the erasure code associated with the communication channels.

11. A method for storing data in storage devices, wherein the storage devices are associated with an erasure code, the method comprising;
determining a fault tolerance for the erasure code associated with the storage devices, wherein the method comprises:
deriving base erasure patterns from a generator matrix of an erasure code;
determining which of the base erasure patterns are adjacent to one another;
XORing the adjacent base erasure patterns with one another to produce child erasure patterns of the erasure code;
combining the base erasure patterns and the child erasure patterns to form a minimal erasure list (MEL) for the erasure code, wherein the MEL corresponds to the fault tolerance of the erasure code; and
determining a reliability for each storage device comprising the storage devices; and
storing data within each of the storage devices in accordance with the reliability of each storage device and in accordance with the fault tolerance of the erasure code associated with the storage devices.

12. The method of claim 11, comprising fragmenting the erasure code across the storage devices.

13. The method of claim 11, comprising associating erasure codes with the storage devices, determining the fault tolerance of each erasure code comprising the erasure codes, and storing data within each of the storage devices in accordance with the reliability of each storage device and the fault tolerance of each erasure code.

14. The method of claim 11, comprising associating an erasure code with a single storage device.

15. The method of claim 11, wherein the storage devices comprise magnetic memory storage devices, optical memory storage devices, flash memory storage devices or a combination thereof.

16. The method of claim 11, comprising creating redundancies in the data stored in the storage devices, wherein the amount of redundancies created in data stored in each of the storage devices depends on the reliability of the storage device and on the MEL of the erasure code.

17. A method for communicating data over communication channels, wherein the communication channels are associated with an erasure code, the method comprising;
determining a fault tolerance for the erasure code associated with the communication channels, wherein the method comprises:
deriving in a computer host base erasure patterns from a generator matrix of an erasure code;
determining in the computer host which of the base erasure patterns are adjacent to one another;
XORing in the computer host the adjacent base erasure patterns with one another to produce child erasure patterns of the erasure code;
combining in the computer host the base erasure patterns and the child erasure patterns to form a minimal erasure list (MEL) for the erasure code, wherein the MEL corresponds to the fault tolerance of the erasure code; and
determining in the computer host a reliability associated with each of the communication channels; and
communicating data over each of the communication channels in accordance with the reliability of each communication channel and the fault tolerance of the erasure code associated with the communication channels.

18. The method of claim 17, comprising fragmenting the erasure code across the communication channels.

19. The method of claim 17, comprising associating erasure codes with the communication channels, determining the fault tolerance of each erasure code comprising the erasure codes, and communicating data over each of the communication channels in accordance with the reliability of each communication channel and the fault tolerance of each erasure code.

20. The method of claim 17, comprising associating an erasure code with a single storage communication channel.

21. The method of claim 17, comprising creating redundancies in the data communicated over the communication channels, wherein the amount of redundancies created in data communicated over each communication channel depends on the reliability of the communication channel and on the MEL of the erasure code.

22. A tangible machine readable medium having computer-executable instructions stored thereon that, if executed by a computer device, cause the compute device to perform operations comprising:
deriving base erasure patterns from a generator matrix of an erasure code;

determining which of the base erasure patterns are adjacent to one another;

XORing the adjacent base erasure patterns with one another to produce child erasure patterns of the erasure code; and combining the base erasure patterns and the child erasure patterns to form a minimal erasure list (MEL) for the erasure code, wherein the MEL corresponds to the fault tolerance of the erasure code, and wherein the MEL is used for allocating the erasure code across multiple devices.

23. The tangible machine readable medium of claim 22, wherein execution terminates when the produced child erasure patterns are not adjacent to any of the base erasures, or when the produced child erasure patterns are identical to previously generated child erasure patterns, or when a predetermined amount of child erasure patterns are produced.

24. The tangible machine readable medium of claim 22, comprising code adapted for determining a reliability for each of the storage devices; and code adapted for storing data within each of the storage devices in accordance with the reliability of each storage device and in accordance with the fault tolerance of the erasure code associated with the storage devices.

25. The tangible machine readable medium of claim 22, comprising code adapted for determining a reliability for each of the communication channels; and code adapted for communicating data over each of the communication channels in accordance with the reliability of each communication channel and the fault tolerance of the erasure code associated with the communication channels.

* * * * *

UNITED STATES PATENT AND TRADEMARK OFFICE
CERTIFICATE OF CORRECTION

| | | |
|---|---|---|
| PATENT NO. | : 8,127,212 B2 | Page 1 of 1 |
| APPLICATION NO. | : 11/904284 | |
| DATED | : February 28, 2012 | |
| INVENTOR(S) | : John Johnson Wylie et al. | |

It is certified that error appears in the above-identified patent and that said Letters Patent is hereby corrected as shown below:

In the Claims:

In column 18, line 64, in Claim 22, delete "compute" and insert -- computer --, therefor.

Signed and Sealed this
Seventh Day of May, 2013

Teresa Stanek Rea
*Acting Director of the United States Patent and Trademark Office*